(12) United States Patent
Inoue et al.

(10) Patent No.: US 6,321,898 B1
(45) Date of Patent: Nov. 27, 2001

(54) DISPLAY PANEL TRANSPORTING APPARATUS AND A DISPLAY PANEL TRANSPORTING UNIT

(75) Inventors: Yoshiyasu Inoue; Masakatsu Hara, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/473,141

(22) Filed: Dec. 28, 1999

(30) Foreign Application Priority Data

Jan. 8, 1999 (JP) .................................................. 11-002544

(51) Int. Cl.[7] .................................................. B65G 47/84
(52) U.S. Cl. ..................... 198/465.1; 198/346.1; 414/222.07
(58) Field of Search ............................. 198/346.1, 346.2, 198/346.3, 468.1, 465.2; 414/403, 222.07, 222.08, 222.09, 331, 332

(56) References Cited

U.S. PATENT DOCUMENTS 4,981,408 * 1/1991 Hughes et al. ............... 414/222.09 X
5,553,988 * 9/1996 Horn et al. ..................... 198/465.1 X
6,027,301 * 2/2000 Kim et al. .................... 414/222.07 X

FOREIGN PATENT DOCUMENTS

| 7-41071 | 2/1995 | (JP) . |
| 2541477 | 7/1996 | (JP) . |
| 8-198405 | 8/1996 | (JP) . |
| 8-274144 | 10/1996 | (JP) . |
| 9-115868 | 5/1997 | (JP) . |
| 10-41369 | 2/1998 | (JP) . |

* cited by examiner

Primary Examiner—James R. Bidwell
(74) Attorney, Agent, or Firm—McGinn & Gibb, PLLC

(57) ABSTRACT

A display panel transporting apparatus and a display panel transporting unit improves efficiency of display panel manufacturing processes and a display panel production line. The display panel transporting unit includes a loaded cassette transporting unit for transporting loaded cassettes in which display panels are housed in a vertical direction, an empty cassette transporting unit for transporting empty cassettes, and a display panel transporting unit for removing display panels from a loaded cassette and loading the display panels in an empty cassette.

31 Claims, 11 Drawing Sheets

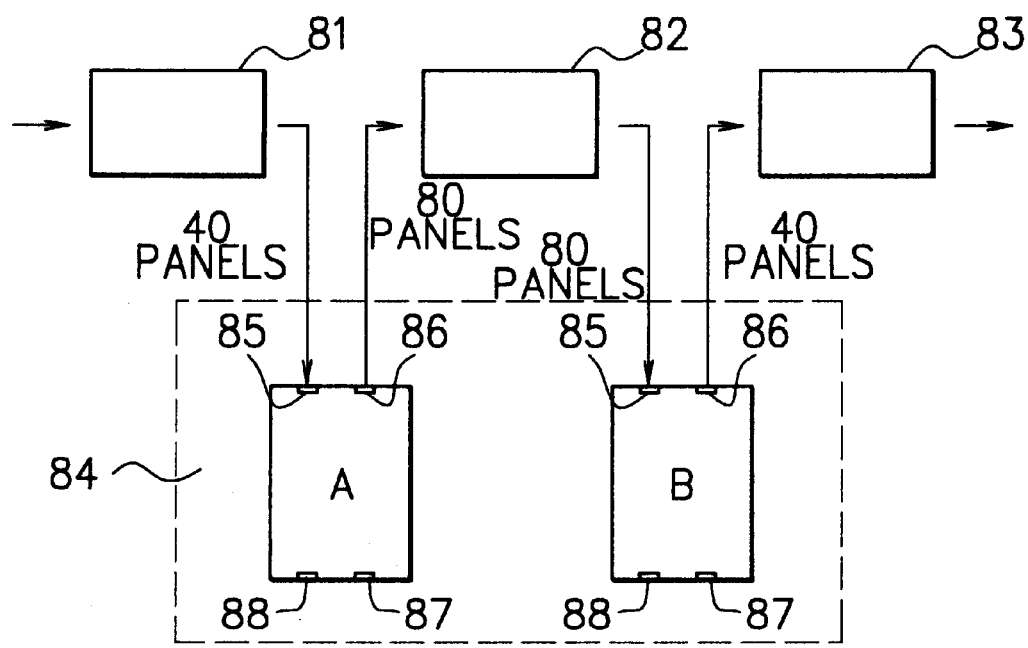
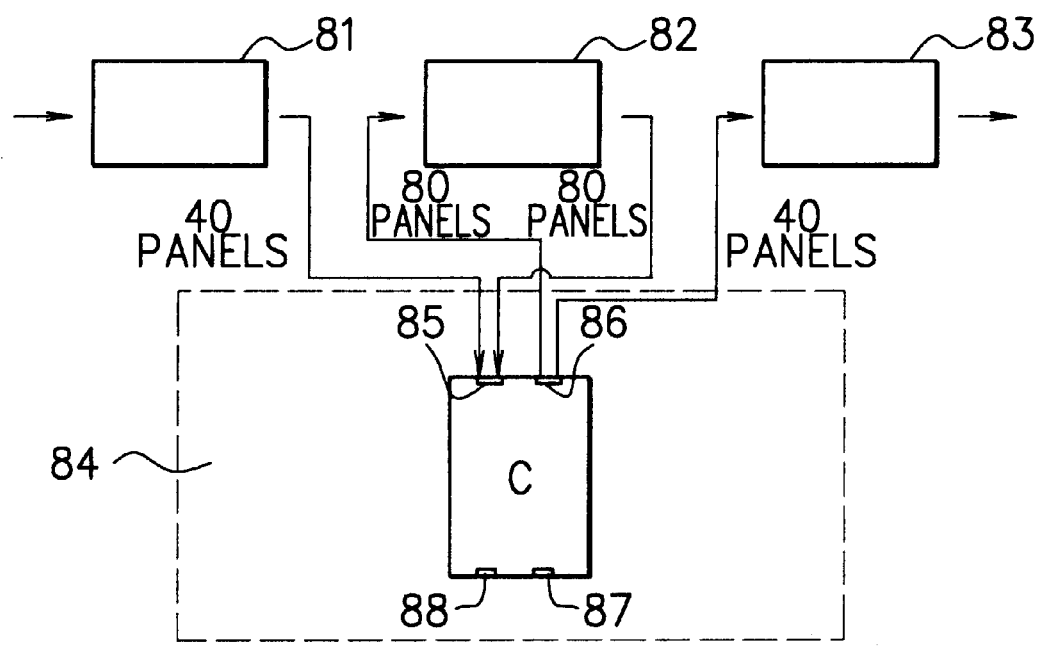

DISPLAY PANEL TRANSPORTING APPARATUS AND A DISPLAY PANEL TRANSPORTING UNIT

BACKGROUND OF THE INVENTION

The present invention relates to a display panel transporting apparatus and a display panel transporting unit used in a process of manufacturing a display panel such as a liquid-crystal panel, and in particular, to a display panel transporting apparatus and a display panel transporting unit in which a display panel is moved from a first cassette in which the display panel is housed to a second cassette.

Description of the Prior Art

In general, a display panel is employed as an output display unit of an electric appliance. Of such display panels, a liquid crystal display panel is particularly used as a display of various appliances such as personal computers and word processors due to its advantageous features, for example, low power consumption, a thin contour, light weight, and low power drive of the display.

A liquid crystal panel includes, as shown in a perspective view and a front view of FIG. 1, two glass substrates, i.e. a thin film transistor (TFT) substrate 1 and a color filter substrate 2. Substrates 1 and 2 are fixed onto each other by a seal 3 with a gap of about 5 micrometers ($\mu$m) to 6 $\mu$m. The gap is filled with a liquid crystal. The panel includes a liquid crystal filling hole 4, namely, seal 3 is not disposed in this region.

A liquid crystal panel of this kind is ordinarily produced through processes shown in FIG. 2. First, a glass substrate having a large area is passed through a TFT substrate manufacturing process including a rinse process, a dry process, an alignment layer print process, a rubbing process, and a sealing process to produce TFT substrate 1. On the other hand, another glass substrate of a large area is subjected to a color filter substrate fabricating process including a rinse process, a dry process, an alignment layer print process, a rubbing process, and a spacer distributing process to manufacture color filter substrate 2.

Subsequently, substrates 1 and 2 are fixed onto each other in a process 7.

The glass substrate obtained is cut, in a cutting process 8, into a plurality of liquid crystal panels of display size, e.g., an appropriate size between 12-inch size to 15-inch size. Specifically, surfaces of substrates 1 and 2 are scribed by a diamond cutter and then are shocked to be separated into liquid crystal panels. Each panel is in the contour shown in FIG. 1.

After the cutting process, the gap of the panel is filled with a liquid crystal material in a filling process 9 as follows. First, a plurality of liquid crystal panels P and a liquid crystal tray 11 filled with a liquid crystal material 10 is placed in a vacuum chamber 12 and then air is exhausted from chamber 12 as shown in FIG. 3. When chamber 12 is at a sufficiently low pressure, a liquid crystal filling hole 4 of each panel P is placed in material 10 of plate 11 and then chamber 12 is set to an atmospheric pressure. Namely, panels P are placed in material 10 at a low pressure and then the pressure in chamber 12 is increased as above. Therefore, the gap of each panel P is completely filled with material 10 due to capillarity and a pressure difference between panel P and chamber 12.

When the gap is completely filled with liquid crystal material 10 in process 9, filling hole 4 of each panel P is sealed by a sealing process 13. Process 13 includes a wiping process, an ultraviolet (UV) resin coating process, a UV ray radiation process, and the like. A polishing process, a polarizing plate fixing process, and an inspection process are then conducted to finally produce completed products of liquid crystal panels.

In the fabricating line of the processes above, a cassette for liquid panels is employed to store, to transport, and to process panels in cutting process 8 and subsequent processes. In general, the cassettes used are equal in an outer shape for the following reason. Although the liquid panels are of various sizes, when the outer size of cassettes are changed for each type of liquid crystal panels, hindrance may occur in the automation of the production. To mount panels having different sizes in a production line, a holder plate is employed to separate the panels of different sizes in the cassette before the cassette is installed in the line.

However, the liquid crystal panel manufacturing process of the prior art is attended with problems as follows.

As the utilization fields of these panels are increased, the size thereof is required to be increased and it is needed to decrease the gap to guarantee a wide angle of visual field and a high response such as a high display speed. The large-sized panel and the decreased gap size lead to the increase in time in the liquid filling process per unitary number of panels as compared with the other processes. For example, filling process 9 requires a period of time which is about four times to five times that of cutting process 8 or sealing process 13. Consequently, it is necessary in the panel production line to reduce the time required for filling process 9.

To improve efficiency in time of process 9, it can be considered, for example, to increase the number of liquid crystal filling apparatuses, which are generally expensive, or to employ cassettes having a large outer size to resultantly increase the number of panels to be housed in each cassette. The idea above may reduce time used in process 9, but may also influence the existing processes and the production line depending on cases. Moreover, this idea is not favorable because of the increase in production cost. Actually, it is necessary to improve the production efficiency in the production processes and the production line as a total.

SUMMARY OF THE INVENTION

It is therefore an object of the present invention, which has been devised to remove the problem of the prior art, to provide a display panel transporting apparatus and a display panel transporting unit capable of improving efficiency of production processes and a production line to produce various types of display panels with a large panel size and a reduced gap in one production line even in a display panel production line in which the line is automated and each process uses a standardized cassette.

To achieve the object in accordance with a first aspect of the present invention, there is provided a display panel transporting apparatus comprising a loaded cassette supply mechanism for supplying a cassette in which display panels are housed in a longitudinal direction, an empty cassette discharge mechanism for discharging an empty cassette from which display panels are removed, an empty cassette supply mechanism for supplying an empty cassette to which display panels are to be housed, a loaded discharge supply mechanism for discharging a cassette in which display panels are housed, and a display panel transporting unit. The display panel transporting unit includes a removal station disposed at a relay point between the loaded cassette supply mechanism and the empty cassette discharge mechanism for removing display panels and a housing station disposed at the empty cassette supply mechanism and the real cassette discharge mechanism for housing display panels in an empty cassette.

When the display panel transporting apparatus is installed in the vicinity of, for example, a liquid crystal filling apparatus used in a liquid crystal filling process of a liquid crystal panel production line, in an operation to transport a cassette loaded with liquid crystal panels from a cutting process to the filling process, the number of panels which are removed from a first cassette ejected from the cutting process and which are housed in a second cassette to be fed to the filling process can be automatically increased. In an operation to transport a cassette from the filling process to a sealing process, the number of panels which are removed from the second cassette undergone the filling process and which are housed in a third cassette to be fed to the sealing process can be automatically decreased. Additionally, since an empty cassette from which the liquid crystal panels are removed can be automatically ejected and an empty cassette in which liquid crystals are to be housed can be automatically supplied, the liquid crystal panels can be efficiently transported from a cassette to another cassette.

Therefore, even in a case in which an existing production line of the prior art is employed, the number of liquid crystal filling apparatuses need not be particularly increased. Namely, it is possible to improve efficiency of liquid crystal panel fabricating processes and a production line of liquid crystal panels.

In accordance with a second aspect to the present invention to solve the problem, the display panel transporting unit is placed substantially at a central position of the display panel transporting apparatus, the real cassette supply mechanism includes a cassette supply hole and the loaded cassette discharge mechanism includes a cassette discharge hole, the holes being arranged on a first side of the unit in the apparatus, and the empty cassette discharge mechanism includes a cassette discharge hole and the empty cassette supply mechanism includes a cassette supply hole. The holes are arranged on a second side of the unit in the apparatus, and the second side is opposite to the first side.

Thanks to the configuration, the supply and discharge side of cassettes loaded with display panels is placed on a first side of the display panel transporting apparatus and the supply and discharge side of empty is placed on a second side of the apparatus. The display panel transporting unit is placed between the first and second sides.

Therefore, when the display panel transporting apparatus is integraly employed used in a display panel production line, an area to handle cassettes loaded with display panels can be separated from an area to handle empty cassettes. This advantageously improves efficiency of the production line.

In accordance with a third aspect to the present invention, each of the removal station and the housing station of the display panel transporting apparatus includes a cassette feed mechanism for changing a position to remove display panels from a cassette and a position to house display panels in a cassette.

Due to the constitution, when display panels are removed from a cassette or are housed in a cassette, the cassette position can be changed. Consequently, it is possible to remove or to house a predetermined number of display panels.

In accordance with a fourth aspect to the present invention, each of the cassette supply mechanism and the cassette discharge mechanism of the display panel transporting apparatus includes a cassette rotating mechanism for changing a direction of a cassette.

Thanks to the configuration above, when display panels are removed from a cassette or are housed in a cassette, the cassette removing or housing direction can be changed in a horizontal plane.

This consequently increases the degree of freedom of the cassette removing direction and the cassette housing direction.

In accordance with a fifth aspect to the present invention, the cassettes are substantially equal in size to each other in the display panel transporting apparatus.

When the cassettes are employed, the production processes and the production line can be improved in efficiency without hindering the automation of the display panel production line.

In accordance with a sixth aspect to the present invention, each of the cassettes of the display panel transporting apparatus includes a pair of outer frames, a plurality of slide shafts, and a pair of display panel holder plates. At least one of the display panel holder plates is slidable on the slide shafts and is fixable at an arbitrary point on the slide shafts.

Since the cassettes can be loaded with any size of display panels, it is possible to improve efficiency of the production processes and the production line can without hindering the automation of the display panel production line for various display panel sizes.

In accordance with a seventh aspect to the present invention, the display panel transporting unit of the apparatus includes a display panel vertical feed mechanism being movable between a position below the removal station and a position below the housing station, the feed mechanism removing display panels upward from a cassette and housing display panels downward in a cassette while supporting the display panels on a lower end surfaces thereof, a display panel top support mechanism for supporting display panels on an upper end surface thereof and vertically moving in connection with the display panel vertical feed mechanism, a display panel holder mechanism for holding a lower end surface and a side end surface of display panels removed from a cassette, and a horizontal feed mechanism including the display panel top support mechanism and the display panel holder mechanism. The horizontal feed mechanism is movable from a point over the removal station to a point over the housing station.

Due to the construction, display panels can be transported in a batch from a cassette to another cassette in a state in which the upper end surface, the lower end surface, and both side surfaces of the panels are being supported. Therefore, the display panels can be transported in a stable state.

In accordance with an eighth aspect to the present invention, in the display panel transporting apparatus, the display panel vertical feed mechanism of the display panel transporting unit includes a display panel holding roller movable along a lower end surface of display panels.

Thanks to the constitution, when the display panel transporting apparatus is employed particularly in a liquid crystal panel production line, the liquid crystal panels can be vertically moved in a stable state without touching the liquid crystal filling hole in a lower end surface of the liquid crystal panels.

It is consequently possible to prevent dust and dirt from fixing on areas in the vicinity of the liquid crystal filling holes.

In accordance with a ninth aspect to the present invention, the display panel transporting apparatus further includes a wiper mechanism below the removal station and below the hosing station for removing dust and dirt fixed on the display panel holder roller of the display panel transporting unit.

In this configuration, dirt and dust fixed on the display panel holder roller can be removed when the display panel vertical feed mechanism which moves between a position below the removal station and a position below the housing station and the display panel holder roller which moves along a lower end surface of the display panels move quite a small distance relative to the wiper mechanism.

Consequently, it is possible to prevent dust and dirt from fixing on areas in the vicinity of the liquid crystal filling holes.

In accordance with a tenth aspect to the present invention, in the display panel transporting apparatus, the display panel top support mechanism of the display panel transporting unit includes a display panel upper surface pitch correcting mechanism. The correcting mechanism includes a comb-shaped plate including a first plate and a second plate. The first plate slides quite a small distance relative to the second plate.

Thanks to the construction, in an operation to support the display panels, the pitches of the panels on an upper end surface thereof can be corrected by a simple mechanism. Consequently, the display panels can be easily aligned to be removed from or to be housed in a cassette.

In accordance with a 11th aspect to the present invention, in the display panel transporting apparatus, the display panel holder mechanism of the display panel transporting unit includes a lower surface receiving roller for supporting a lower end surface of display panels, and a side surface receiving roller for supporting a side surface of display panels.

Due to the configuration, after the display panels are moved upward by the display panel vertical feed mechanism, the lower end surface and both side surfaces of the display panels can be simultaneously supported. Therefore, after the display panels are moved upward by the display panel vertical feed mechanism, the display panel holding roller can be easily released.

In accordance with a 12th aspect to the present invention, the display panel transporting apparatus further includes a wiper mechanism on each of both end sections of a track of a vertical feed stroke of a horizontal feed mechanism for removing dirt and dust fixed on the lower surface receiving roller of the display panel transporting unit.

In this configuration, dirt and dust fixed on the display panel holder roller can be removed when the horizontal feed mechanism and the display panel holder mechanism move quite a small distance relative to the wiper mechanism.

It is therefore possible to prevent dust and dirt from fixing on areas in the vicinity of the liquid crystal filling holes.

In accordance with a 13th aspect to the present invention, the display panel transporting unit of the display panel transporting apparatus includes a display panel side surface pitch correcting mechanism. The display panel side surface pitch correcting mechanism includes a comb-shaped plate including a first plate and a second plate. The first plate slides quite a small distance relative to a second plate.

Due to the configuration, in an operation to support the display panels, the pitches of the panels on the side surface thereof can be corrected by a simple mechanism, and hence the display panels can be easily aligned to be removed from or to be housed in a cassette.

In accordance with a 14th aspect to the present invention, the display panel transporting unit of the display panel transporting apparatus is tilted quite a small angle in a pitch direction of display panels.

In this construction, the display panels arranged in a longitudinal direction are inclined in one direction due to gravity, which consequently equalizes the pitches of the display panels housed in a cassette.

In accordance with a 15th aspect to the present invention, the display panel transporting apparatus further includes a cassette positioning mechanism for correcting a stop position of a cassette to stop at the removal station and at the housing station.

Due to the constitution, the cassette from which display panels are to be removed or in which display panels are to be housed can be set to an appropriate position through a fine adjustment. This prevents accidents such as damages of display panels in the panel removing and housing operations.

In accordance with a 16th aspect to the present invention to solve the problem, there is provided a display panel transporting unit comprising a display panel vertical feed mechanism being movable between a position below the removal station at which a cassette loaded with display panels in a longitudinal direction is placed to remove display panels therefrom and a position below the housing station at which a cassette is placed to house therein the removed display panels, the feed mechanism removing display panels upward from a cassette and housing display panels downward in a cassette while supporting the display panels on a lower end surfaces thereof, a display panel top support mechanism for supporting display panels on an upper end surface thereof and vertically moving in connection with the display panel vertical feed mechanism, a display panel holder mechanism for holding a lower end surface and a side end surface of display panels removed from a cassette, and a horizontal feed mechanism including the display panel top support mechanism and the display panel holder mechanism. The horizontal feed mechanism is movable from a point over the removal station to a point over the housing station.

Thanks to the constitution, it is possible to transport the display panels in a batch from a cassette to another cassette by supporting the upper end surface, the lower end surface, and both side surfaces of the panels. Therefore, the display panels can be transported in a batch in a stable state.

In accordance with a 17th aspect to the present invention, the display panel vertical feed mechanism of the display panel transporting unit includes a display panel holding roller movable along a lower end surface of display panels.

Due to the construction, when the display panel transporting apparatus is utilized particularly in a liquid crystal panel production line, it is possible to vertically move the liquid crystal panels in a stable state without touching the liquid crystal filling hole in a lower end surface of the liquid crystal panels.

This advantageously prevents dust and dirt from fixing on areas in the vicinity of the liquid crystal filling holes.

In accordance with an 18th aspect to the present invention, the display panel transporting unit further includes a wiper mechanism below the removal station and below the hosing station for removing dust and dirt fixed on the display panel holder roller of the display panel transporting unit.

In this configuration, it is possible to remove dirt and dust fixed on the display panel holder roller can when the display panel vertical feed mechanism to move between a position below the removal station and a position below the housing station and the display panel holder roller to move along a lower end surface of the display panels move quite a small distance relative to the wiper mechanism.

This consequently prevents dust and dirt from fixing on areas in the vicinity of the liquid crystal filling holes.

In accordance with a 19th aspect to the present invention, the display panel top support mechanism of the display panel transporting unit includes a display panel upper surface pitch correcting mechanism. The correcting mechanism includes a comb-shaped plate including a first plate and a second plate. The first plate slides quite a small distance relative to the second plate.

Due to the construction, in an operation to support the display panels, the pitches of the panels on an upper end surface thereof can be appropriately corrected by a simple mechanism, and hence the display panels can be easily aligned to be removed from or to be housed in a cassette.

In accordance with a 20th aspect to the present invention, the display panel holder mechanism of the display panel transporting unit includes a lower surface receiving roller for supporting a lower end surface of display panels, and a side surface receiving roller for supporting a side surface of display panels.

Thanks to the configuration, after the display panels are moved upward by the display panel vertical feed mechanism, it is possible to simultaneously support the lower end surface and both side surfaces of the display panels. In consequence, after the display panels are moved upward by the display panel vertical feed mechanism, the display panel holding roller can be easily released.

In accordance with a 21st aspect to the present invention, the display panel transporting unit further includes a wiper mechanism on each of both end sections of a track of a vertical feed stroke of a horizontal feed mechanism for removing dirt and dust fixed on the lower surface receiving roller of the display panel transporting unit.

In this configuration, dirt and dust fixed on the display panel holder roller can be wiped away when the horizontal feed mechanism and the display panel holder mechanism move quite a small distance relative to the wiper mechanism.

It is consequently possible to prevent dust and dirt from fixing on areas in the vicinity of the liquid crystal filling holes.

In accordance with a 22nd aspect to the present invention, the display panel transporting unit includes a display panel side surface pitch correcting mechanism. The display panel side surface pitch correcting mechanism includes a comb-shaped plate including a first plate and a second plate. The first plate slides quite a small distance relative to the second plate.

Thanks to the structure above, in an operation to support the display panels, the pitches of the panels on the side surface thereof can be appropriately corrected by a simple mechanism. Therefore, the display panels can be easily aligned to be removed from or to be housed in a cassette.

In accordance with a 23rd aspect to the present invention, the display panel transporting unit tilts quite a small angle in a pitch direction of display panels.

In the configuration, the display panels arranged in a longitudinal direction are inclined in one direction due to gravity. This resultantly equalizes the pitches of the display panels housed in a cassette.

In accordance with a 24th aspect to the present invention, the display panel transporting unit further includes a cassette positioning mechanism for correcting a stop position of a cassette to stop at the removal station and at the housing station.

In the constitution, the cassette from which display panels are to be removed or in which display panels are to be housed can be set to an appropriate position through a fine adjustment. This prevents accidents such as damages of display panels in the panel removing and housing operations.

BRIEF DESCRIPTION OF THE DRAWINGS

The objects and features of the present invention will become more apparent from the consideration of the following detailed description taken in conjunction with the accompanying drawings in which:

FIGS. 11A and 11B are block diagrams showing a relationship between a display panel transporting apparatus and a display panel production line in accordance with the present invention.

DESCRIPTION OF THE PREFERRED EMBODIMENTS

Referring next to the drawings, description will be given of an embodiment in accordance with the present invention.

Figure 4:
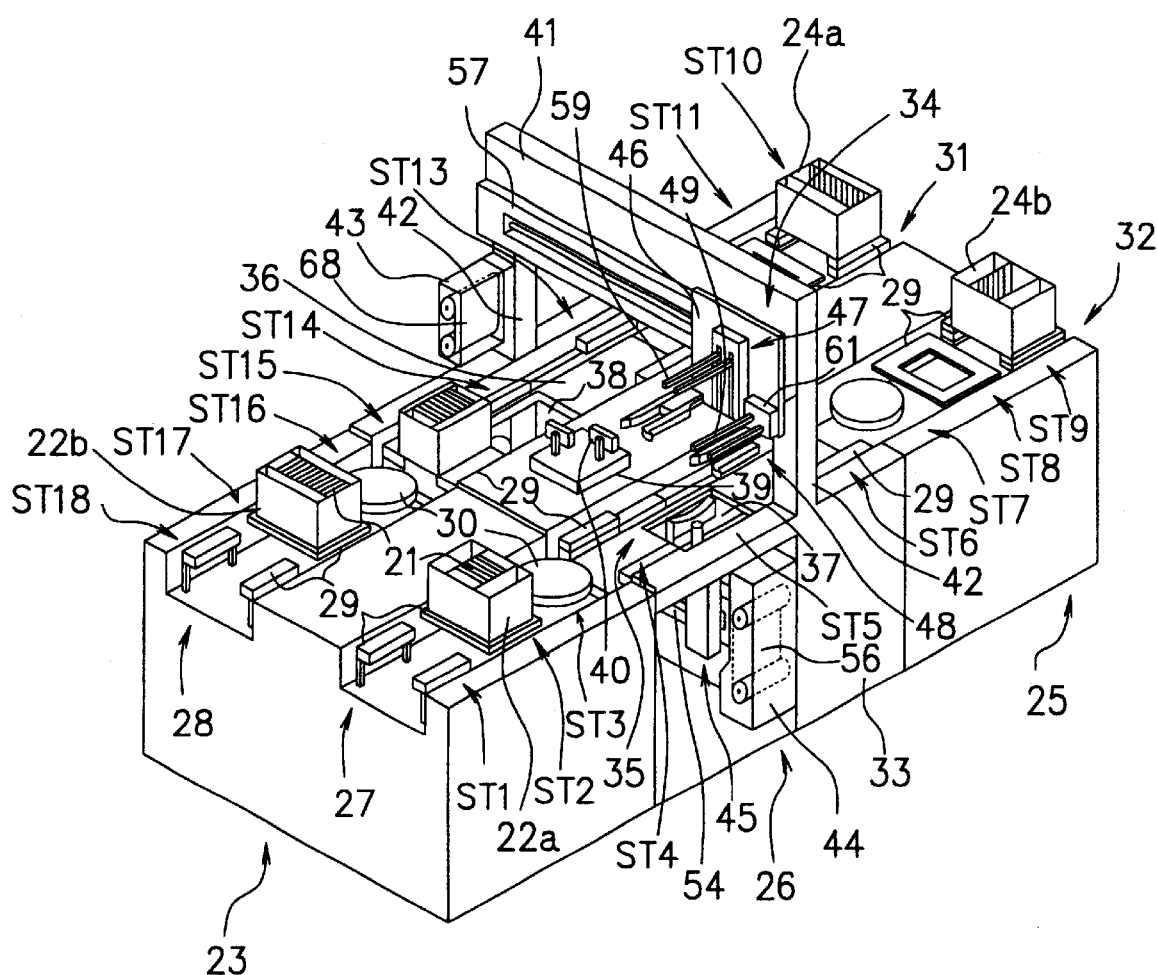
FIG. 4 is a perspective view showing a display panel transporting apparatus in accordance with the present invention.

In this embodiment of the present invention, as can be seen from the perspective view of FIG. 4, a display panel primarily includes a loaded cassette transporting unit 23 to transport loaded cassettes 22a and 22b in which display panels 21 are loaded in a longitudinal direction thereof, an empty cassette transporting unit 25 to transport empty cassettes 24a and 24b, and a display panel transporting unit 26 which removes display panel 21 from loaded cassette 22a and which loads display panel 21 in empty cassette 24a. Unit 26 is placed at a central position of the display panel transporting apparatus, and units 23 and 25 are located respectively at a front side of unit 26 and at a rear side thereof in FIG. 4.

Figure 1:
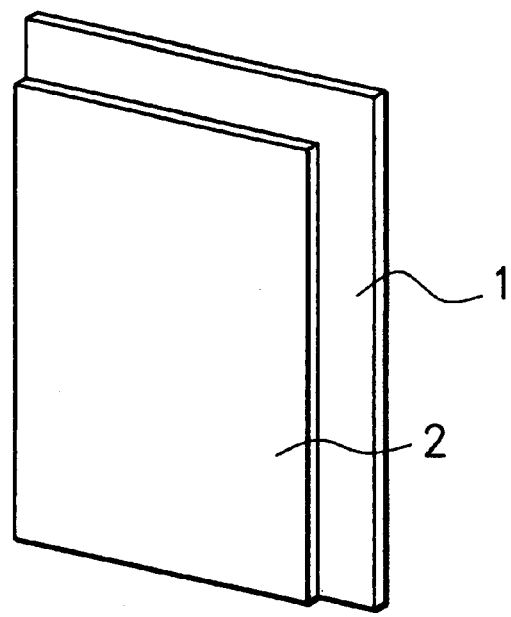
FIG. 1 is a diagram showing a perspective view and a front view of the display panel.
Figure 1:
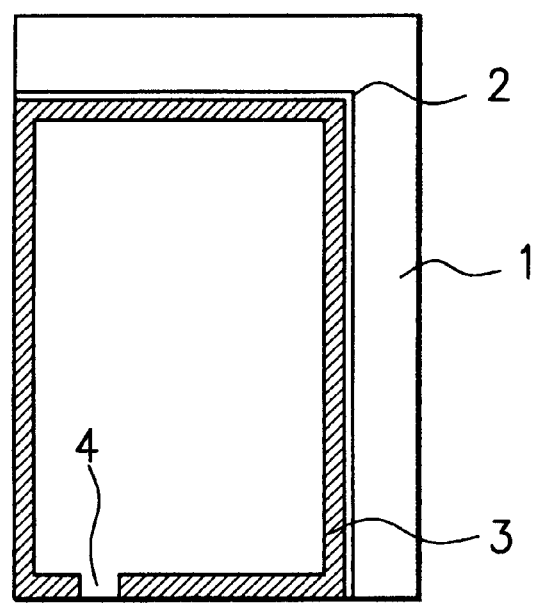
Figure 2:
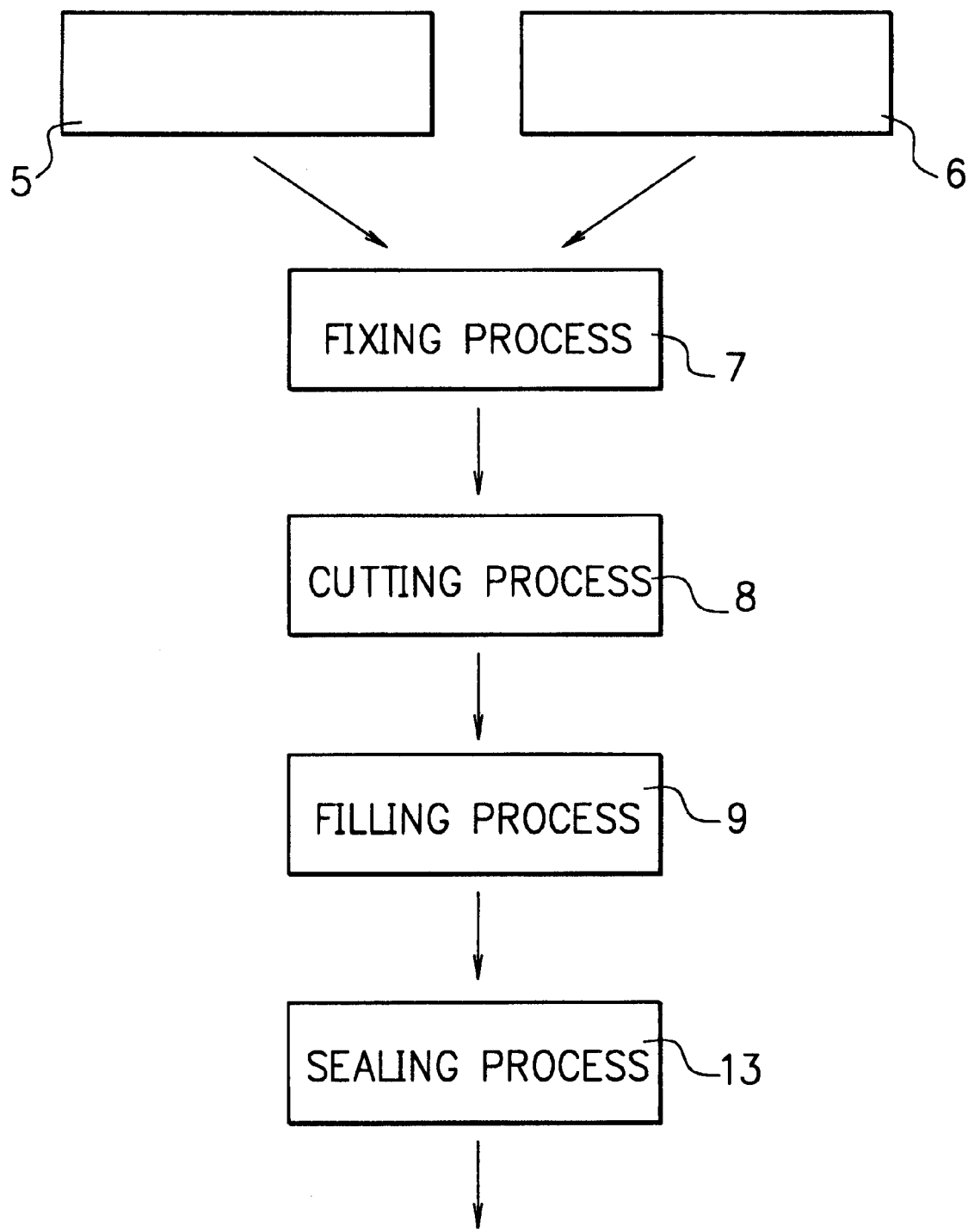
FIG. 2 is a flow diagram showing processes to manufacture a display panel.
Figure 3:
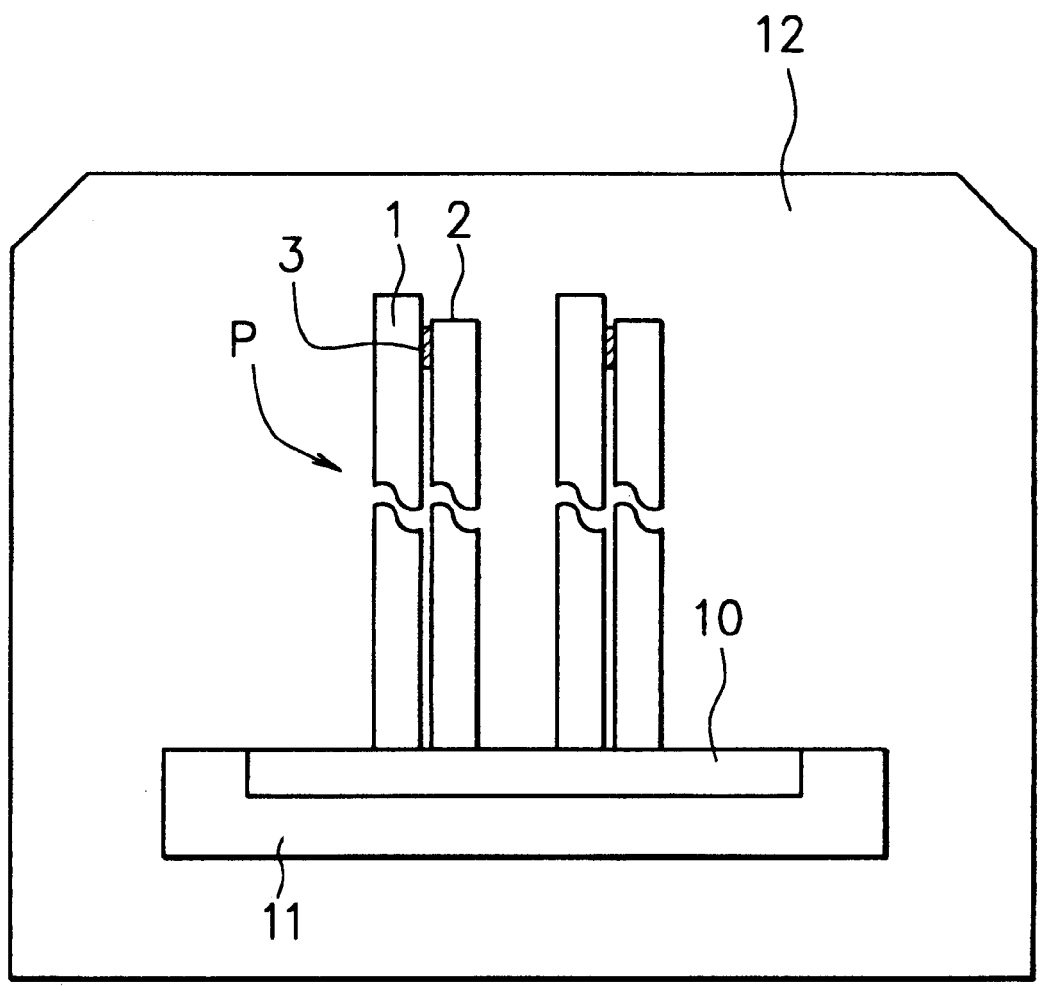
FIG. 3 is a cross-sectional diagram showing a process to fill a display panel with liquid crystal.

Loaded cassette transporting unit 23 includes a loaded cassette supply mechanism 27 to supply loaded cassette 22a in display panel transporting unit 26 and a loaded cassette discharge mechanism 28, on the left of unit 27 in FIG. 1, to discharge loaded cassette 22b in which display panels 21 are loaded by unit 26.

Loaded cassette supply mechanism 27 includes first, second, and third stations ST1, ST2, and ST3 at which loaded cassette 22a stops when loaded cassette 22a is supplied to display panel transporting unit 26. Cassette 22a is transported through first, second, and third stations ST1, ST2, and ST3 in this order. An intermittent transporting mechanism, not shown, is utilized to transport cassette 22a. Disposed at each of first and second stations ST1 and ST2 is a cassette holding plate 29 to receive cassette 22a. At third station ST3, there is arranged a cassette turning mechanism 30 with a circular contour capable of changing a direction of cassette 22a in a horizontal plane. In third station ST3, the direction of cassette 22a can be changed by mechanism 30 to transport cassette 22a to transporting unit 26. However, cassette 22a may also be transported to unit 26 without using turning mechanism 30, namely, without altering the direction of cassette 22a.

Similarly, loaded cassette transporting mechanism 28 includes 16th, 17th, and 18th stations ST16, ST17, and ST18 at which loaded cassette 22b stops when loaded cassette 22a is discharged from display panel transporting unit 26. Cassette 22b is fed through 16th, 17th, and 18th stations ST16, ST17, and ST18 16th, 17th, and 18th stations ST16, ST17, and ST18 in this sequence, namely, in a direction of stream opposite to that of loaded cassette supply mechanism 27. Like in supply mechanism 27, a cassette holding plate 29 to receive cassette 22b is arranged at each of 17th and 18th stations ST17 and ST18. At 16th station ST16, there is disposed a cassette turning mechanism 30 of a circular shape capable of changing a direction of cassette 22b in a horizontal plane.

Empty cassette transporting unit 25 includes, in a left-hand section thereof in FIG. 4, an empty cassette supply mechanism 31 to supply empty cassette 24a to display panel transporting unit 26 and an empty cassette discharge mechanism 32, in a right-hand section thereof in FIG. 4, to discharge empty cassette 24a from which display panels are removed in unit 26.

Empty cassette supply unit 31 and loaded cassette supply unit 32 are almost equal in fundamental constitution to each other. Unit 31 includes 10th, 11th, and 12th stations ST10, ST11, and ST12, not shown. Empty cassette 24a stops at these stations when empty cassette 24a is supplied to display panel transporting unit 26. Cassette 24a is delivered through 10th, 11th, and 12th stations ST10, ST11, and ST12 in this sequence. As in supply mechanism 27, a cassette holding plate 29 to receive cassette 24a is disposed at each of 10th and 11th stations ST10 and ST11. Disposed at 12th station ST12 is a cassette turning mechanism 30 of a circular shape capable of changing a direction of cassette 24a in a horizontal plane.

Similarly, empty cassette discharge mechanism 32 includes seventh, eighth, and ninth stations ST7, ST8, and ST9 at which empty cassette 24b stops when empty cassette 24b is discharged from display panel transporting unit 26. Cassette 24b is transported through seventh, eighth, and ninth stations ST7, ST8, and ST9 in this order, namely, in a flow direction reverse to that of empty cassette supply mechanism 31. Like in supply mechanism 31, a cassette holding plate 29 to receive cassette 24b is disposed at each of eighth and ninth stations ST8 and ST9. Disposed at seventh station ST7 is a cassette turning mechanism 30 of a circular shape capable of changing a direction of cassette 24b in a horizontal plane.

Description will now be given of display panel transporting unit 26.

Unit 26 includes a frame 33 and a display panel moving mechanism 34. As shown in FIG. 4, unit 26 is installed to tilt about 1° toward a side of unit 25. This tilted state of unit 26 toward unit 25 means that display panels 21 set in the longitudinal direction tilt in one direction. This leads to an equal pitch for display panels 21 housed in the cassette, which will be described later.

Frame 33 includes, in a right-hand section on an upper surface thereof, a cassette transporting mechanism 35 to transport loaded cassette 22a and empty cassette 24b, and a cassette transporting mechanism 35, in a left-hand section on an upper surface thereof, to transport empty cassette 24a and loaded cassette 22b.

Mechanism 35 includes a fourth station ST4, a fifth station ST5 (removal station), and a sixth station ST6. Loaded cassette 22a is transported by an intermittent transporting mechanism, not shown, through fourth, fifth, and sixth stations ST4, ST5, and ST6 in this sequence. Disposed in fifth station ST5 is a rectangular hole 37 through which a display panel vertical feed mechanism 45 of mechanism 34 passes. At fifth station ST5, display panels 21 are removed from loaded cassette 22a. Therefore, when display panels 21 are removed from loaded cassette 22a transported from fourth station ST4 to fifth station ST5, the cassette becomes an empty cassette 24b and is delivered to sixth station ST6. Cassette holding plate 29 is arranged at each of forth and sixth stations ST4 and ST6 to receive loaded cassette 22a and empty cassette 24b, respectively. Arranged in fifth station ST5 is a cassette moving mechanism, not shown, to move a position of loaded cassette 22a in a pitch longitudinal) direction of the display panel. By changing the position of loaded cassette 22a by this mechanism, it is possible to alter the number of display panels 21 in loaded cassette 22a to be removed in one cycle by display panel transporting mechanism 34 which will be described later.

Cassette transporting mechanism 36 is almost equal in basic structure with cassette supply mechanism 35. Mechanism 36 includes a 13th station ST13, a 14th station ST14 (load station), and a 15th station ST15. Empty cassette 24a is delivered by an intermittent transporting mechanism, not shown, through 13th, 14th, and 15th stations ST13, ST14, and ST15 in this order. Arranged in 14th station ST14 is a hole 38 as in fifth station ST5. In 14th station ST14, display panels 21 are loaded in empty cassette 24a by display panel transporting mechanism 34 which will be described later. Therefore, when display panels 21 are loaded in empty cassette 24a transported from 13th station ST13 to 14th station ST14, the cassette becomes a loaded cassette 22b and is fed to 15th station ST15. Cassette holding plate 29 is arranged at each of 13th and 15th stations ST13 and ST15 to receive empty cassette 24a and loaded cassette 22b, respectively. As in fifth station ST5, there is arranged in 14th station ST14 a cassette moving mechanism, not shown. By changing the position of empty cassette 24a by this mechanism, it is possible to alter the number of display panels 21 to be loaded in empty cassette 24a in one cycle by display panel transporting mechanism 34 which will be described later.

Frame 33 above includes a cassette positioning mechanism 39, in a central section on the upper surface thereof, between fifth and 14th stations ST5 and ST14. Mechanism 39 detects by a sensor 40 a groove disposed in a side plate of loaded cassette 22a stopped at fifth station ST5 or empty cassette 24a stopped at 14th station ST14, sensor 40 being placed at a side of stations ST5 and ST 14. According to a result of the detection of the groove, mechanism 39 corrects the stop position of loaded cassette 22a or empty cassette 24a. For the correction, loaded cassette 22a or empty cassette 24a is moved by the cassette moving mechanism, not shown.

Frame 33 further includes, in each of two foot sections 42 of a holder block 41 of display panel transporting mechanism, which will be described later, a wiper mechanism 43 to remove dust or dirt such as liquid crystal fixed on a lower-surface receiving roller 62. However, FIG. 4 shows only one wiper mechanism 43 for convenience of explanation. Mechanism will be described in detail later. Frame 33 also includes a similar wiper mechanism 44 in a lower section of each of fifth and 14th stations ST5 and ST14. Mechanism 44 will also be described later.

Description will now given of display panel transporting mechanism 34 integrally installed in frame 33. As can be seen from the perspective views of FIGS. 4 to 5, mechanism 34 includes a display panel vertical feed mechanism 45 at a position below fifth station ST5, a horizontal feed mechanism 46 disposed in holder block 41 of mechanism 34, and a display panel upper section holding mechanism 47, a display panel holding mechanism 48, and display panel side pitch correcting mechanism 49 attached to vertical feed mechanism 46.

Figure 6:
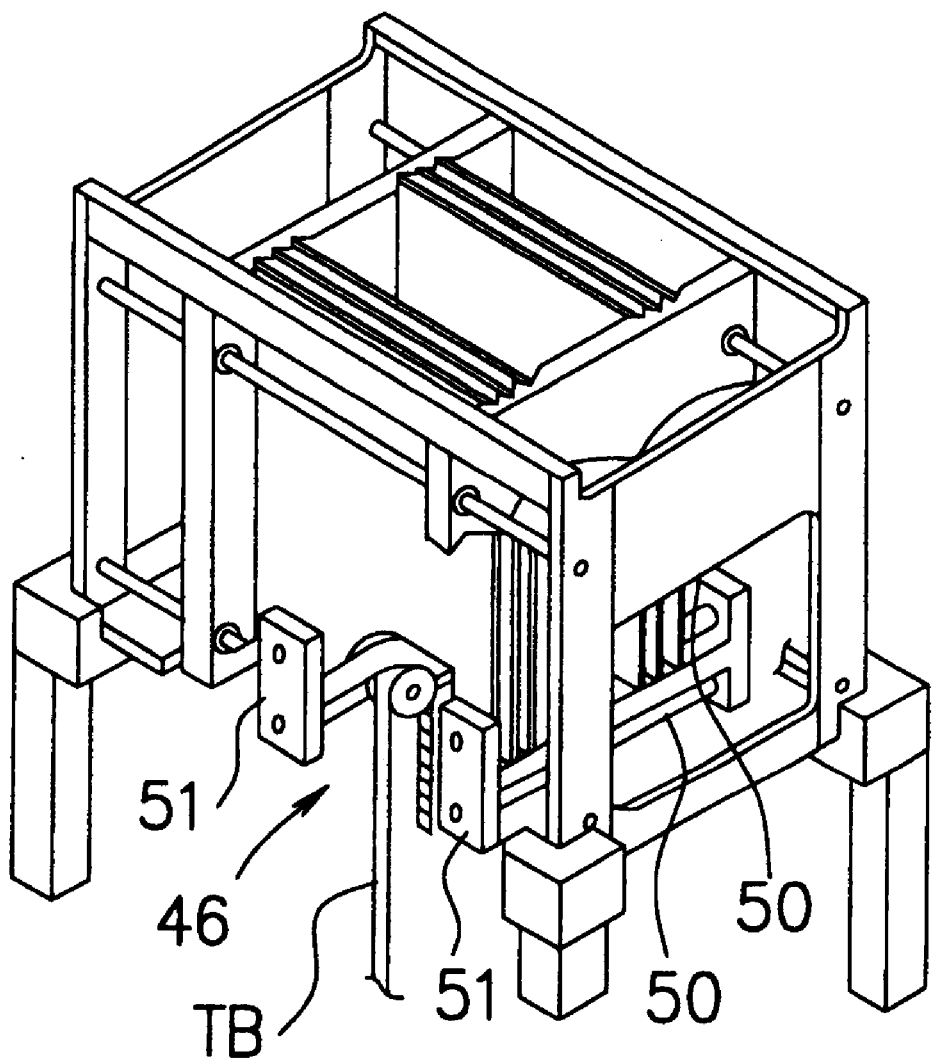
FIG. 6 is a perspective view showing cassettes placed in a fifth station ST5 of the display panel transporting apparatus in accordance with the present invention.
Figure 7:
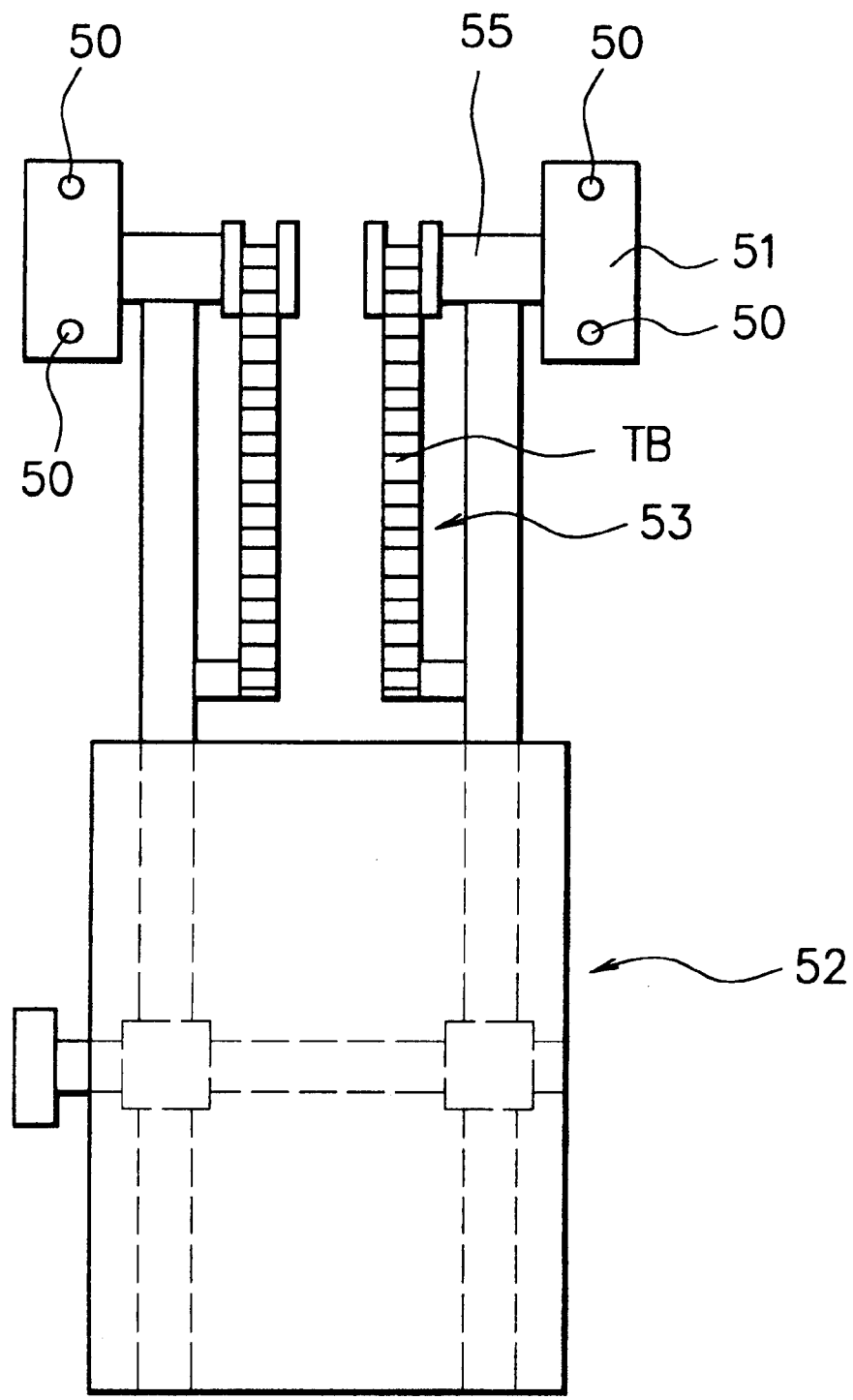
FIG. 7 is a front view showing a display panel vertical feed mechanism of the display panel transporting apparatus in accordance with the present invention.

Vertical feed mechanism 45 includes, as shown in the perspective view of FIG. 6 and the front view of FIG. 7, a pair of roller guides 51 each including two display panel holding rollers 50 vertically arranged, a roller distance adjuster mechanism 52 to adjust distance between rollers 50 to be brought into contact with a lower end surface of display panels 21, a roller guide rotating mechanism 53 to rotate roller guides 51, and a driving motor, not shown. To rotate roller guide 51, mechanism 53 imparts driving force of the motor via a timing belt TB to a rotating axis 55 of roller guide 51. Vertical feed mechanism 45 is driven by a driving motor, not shown to vertically move between a position below fifth station ST5 and a position below 14th station ST14 along a vertical feed slide guide 54 disposed in frame 33.

Vertical feed mechanism 45 operates as follows. When display panels 21 are removed from loaded cassette 22a stopped at fifth station ST5, mechanism 45 supports a lower end surface of display panels 21 by rollers 50 and then mechanism is lifted upward by the driving motor to resultantly move display panels 21 upward. When display panels 21 are loaded in empty cassette 24a stopped at 14th station ST14, mechanism 45 supports a lower end surface of display panels 21 by rollers 50 and then mechanism is lowered by the driving motor to resultantly move display panels 21 downward.

In feed mechanism 45, the distance between rollers 50 brought into contact with a lower end surface of panels 21 can be adjusted by adjuster mechanism 52. Therefore, panels 21 can be lifted upward without touching the liquid crystal supplying hole disposed in the lower end surface of each panel 21. This consequently prevents dirt and dust from fixing to a section of panel 21, the section forming the liquid crystal supplying hole. As shown in FIG. 4, frame 33 includes wiper mechanism 44 including a roll of wiper sheet 56 at a position below fifth station ST5 and a position below 14th station ST14. Therefore, when rollers 50 becomes dirty due to liquid crystal or the like, the dirt is removed as follows. Rotating mechanism 53 is activated to rotate roller guides 51 a half rotation and then adjusting mechanism 52 is driven to bring roller guide 51 into contact with wiper sheet 56 to absorb or wipe away the dirt from rollers 50.

Vertical feed mechanism 46 is attached onto a vertical feed slide guide 57 of holder block 41 of mechanism 34 and is driven by a driving motor, not shown, to vertically move between a position above fifth station ST5 and a position above 14th station ST14 along a groove of guide 57.

Attached on mechanism 46 are display panel upper section holding mechanism 47, display panel holding mechanism 48, and display panel side pitch correcting mechanism 49.

Figure 5:
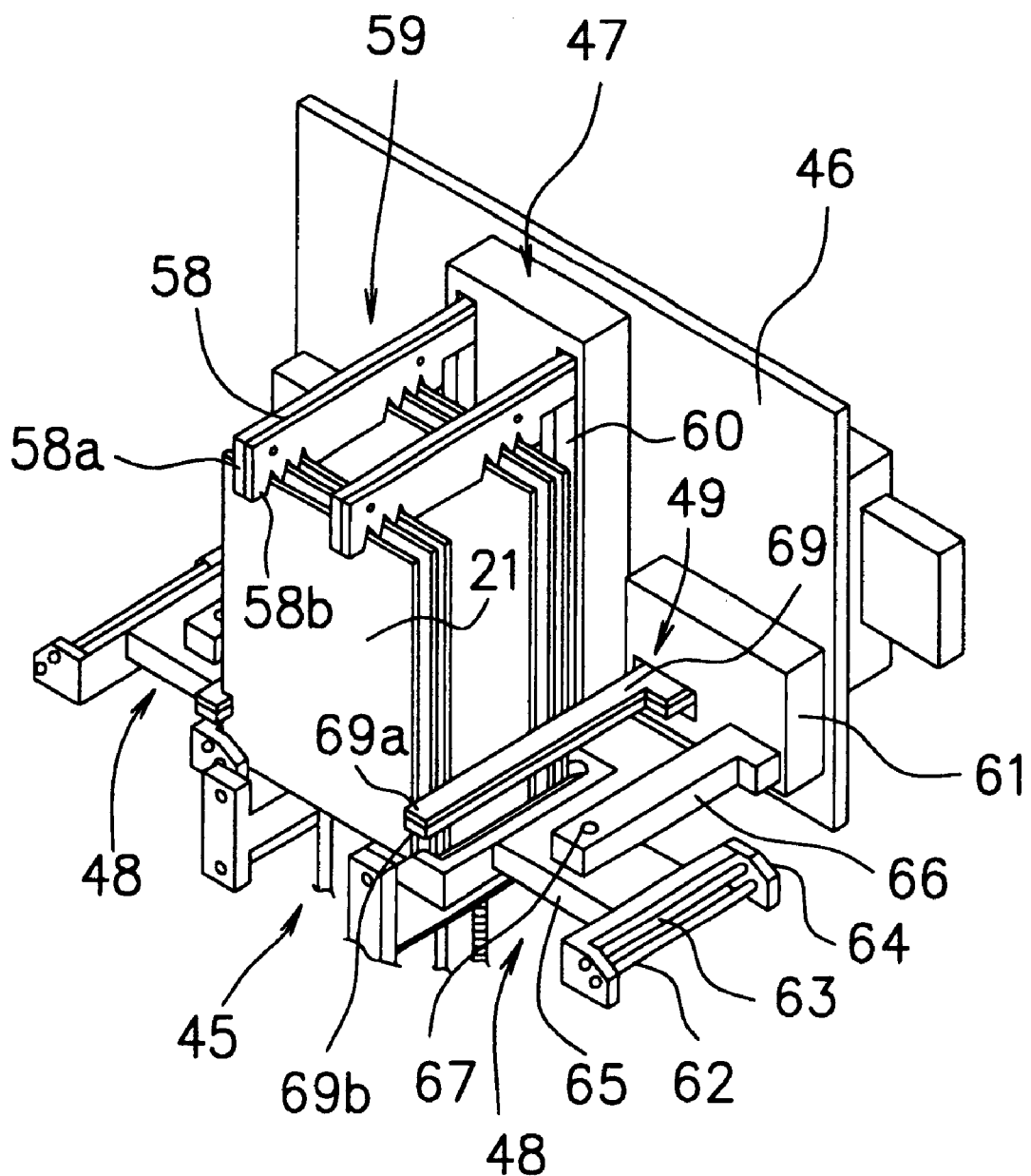
FIG. 5 is a perspective view showing a display panel transporting mechanism of the display panel transporting apparatus in accordance with the present invention.

Mechanism 47 includes, as shown in FIG. 5, a display panel upper pitch correcting mechanism 59 including a comb-shaped plate 58 including two constituent plates 58a and 58b, and plate 58 moves up and down along a long groove 60. As can be seen from FIG. 8, plate 58 slides quite a small distance relative to plate 58a.

On each side of mechanism 47, there are disposed holder mechanism 48 and pitch correcting mechanism 49, which are attached on a slide guide 61 of horizontal feed mechanism 46 to slide in a horizontal direction. Holder mechanism 48 includes a holder section 64 including a lower surface receiving roller and a side surface receiving roller 63, a rotating mechanism 65 with holder section 64 on each of both ends thereof, and an arm 66. Holder section 64 is driven by rotating mechanism 65 to rotate about an axis 67 in a horizontal plane.

As described above, frame 33 shown in FIG. 4 includes, at each of two foot sections 42 of holder block 41 of mechanism 34, wiper mechanism 43 to remove dust such as liquid crystal fixed on roller 62. Only one wiper mechanism is shown in FIG. 4 for convenience of explanation. Wiper mechanism 43 and wiper mechanism 44 are almost equal in configuration to each other. Thanks to wiper mechanism 43, when rollers 62 supporting a lower end surface of display panels 21 becomes dirty due to liquid crystal or the like, the dirt and be removed as follows. Rotating mechanism 65 is operated to rotate holder section 64 a half rotation and then arm 66 is moved to bring roller 62 into contact with a roll of wiper sheet 68 to absorb or wipe away the dirt from rollers 62.

Figure 8:
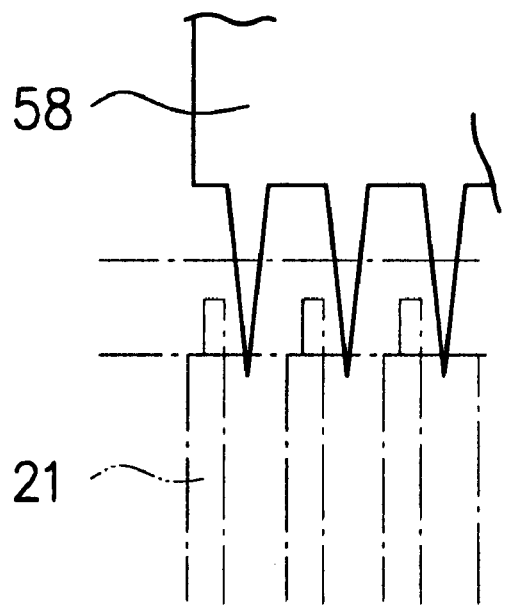
FIG. 8 is a front view showing a sliding state of a duplicated comb-shaped plate of the display panel transporting apparatus in accordance with the present invention.
Figure 8:
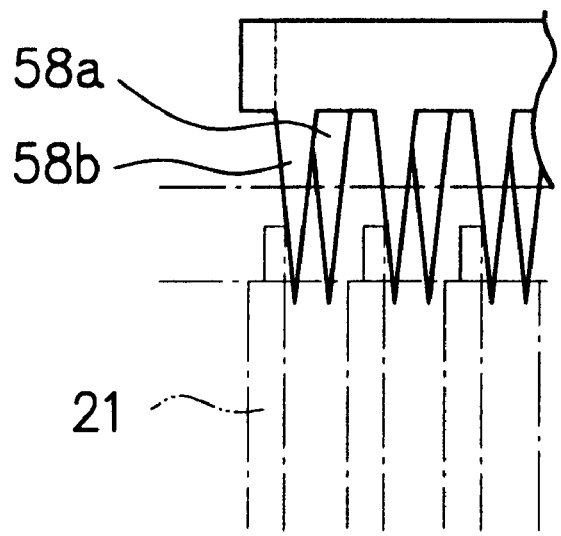

Pitch correcting mechanism 49 includes, as mechanism 47 shown in FIG. 8, a comb-shaped plate 69 including plates 69a and 69b. Plate 69b slides quite a small distance relative to plate 69a.

Horizontal feed mechanism 46 includes a cassette positioning mechanism, not shown. This mechanism detects, by a sensor disposed at an upper position, an edge disposed on a side plate of loaded cassette 22a stopped at fifth station ST5 or empty cassette 24a stopped at 14th station ST14 to thereby correct the stop position of cassette 22a or 24a.

Figure 9A:
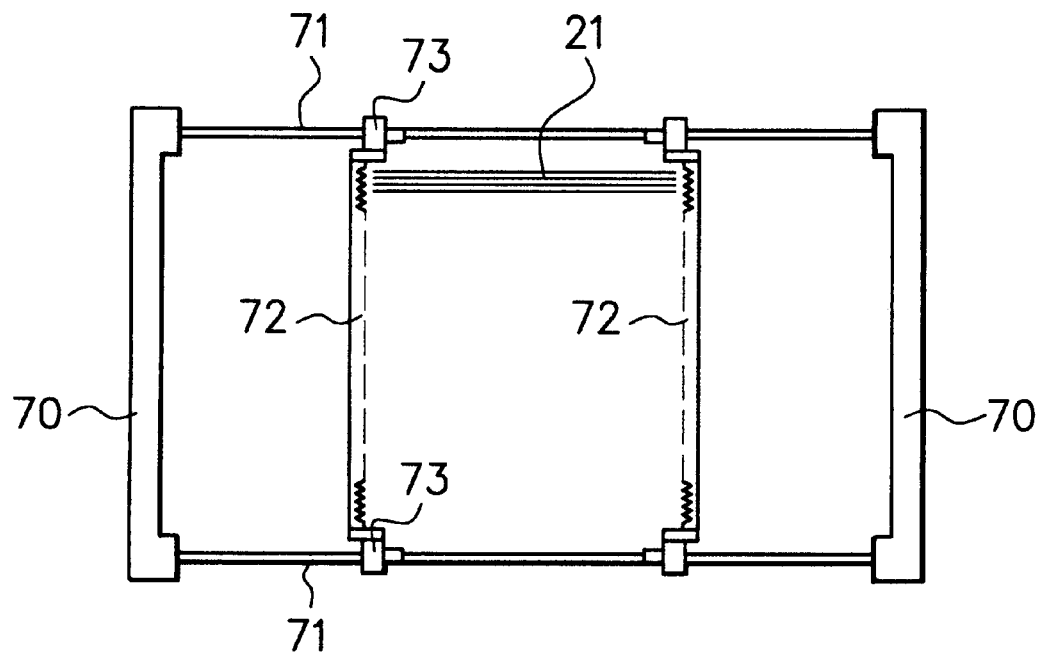
FIGS. 9A and 9B are plan views showing a cassette employed in the display panel transporting apparatus in accordance with the present invention.
Figure 9B:
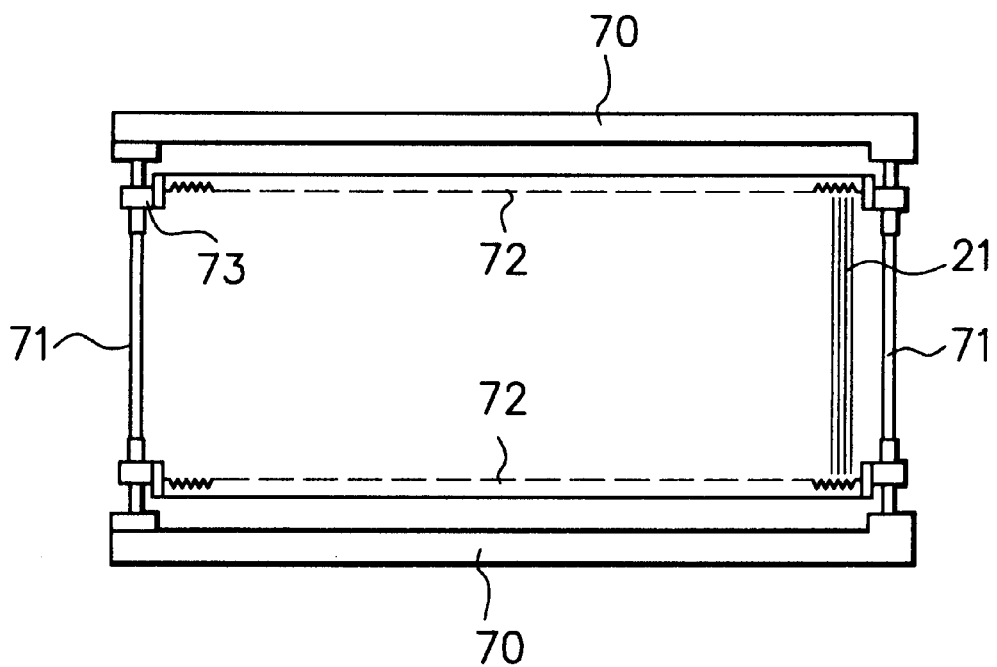

FIGS. 9A and 9B show, in plan views, cassettes used in the embodiment of the display panel transporting apparatus described above. FIG. 9A corresponds to loaded cassette 22a and empty cassette 24b shown in FIG. 4. The cassette is schematically shown in the perspective view of FIG. 6 in which a lock mechanism, which will be described later, is omitted. FIG. 9B corresponds to loaded cassette 22b and empty cassette 24a shown in FIG. 4.

As can be seen from FIG. 9A, cassette 22a or 24b includes a pair of outer frames 70, a plurality of slide shafts 71 arranged between outer frames 70, and a pair of display panel holder plates 72 to hold display panels. A lock mechanism 73 is disposed at each of both ends of each holder plate 72. Lock mechanism 73 is attached on slide shaft 71. Paired panel holder plates 72 sliding on shaft 71 can be locked at a particular position by lock mechanism 73. Therefore, distance between paired panel holder plates 72 can be varied in accordance with size of display panels. Namely, display panels of various sizes can be loaded in the cassette.

Figure 10:
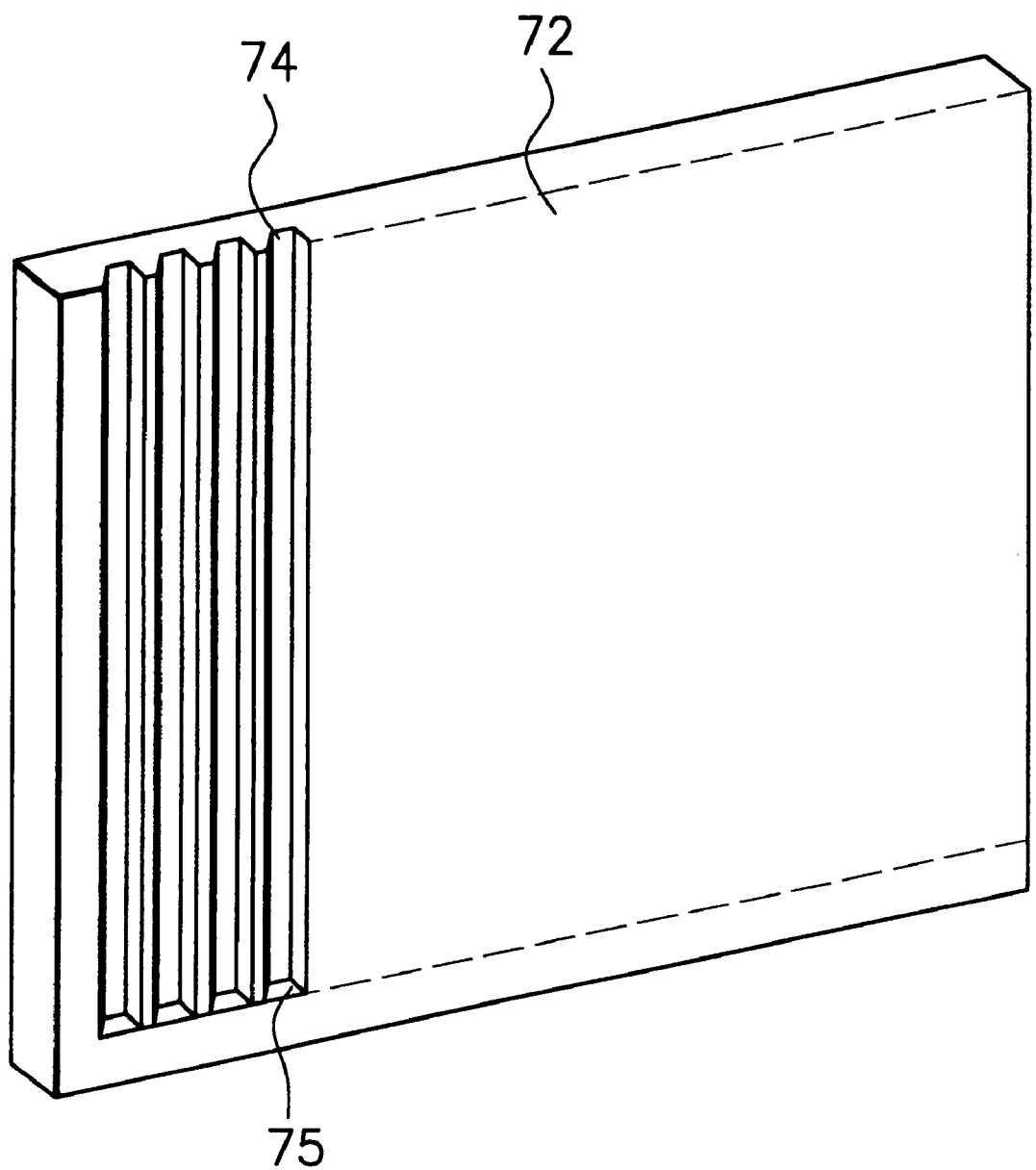
FIG. 10 is a perspective view showing a display panel holding plate of a cassette used in the display panel transporting apparatus in accordance with the present invention.

Holder plate 72 has a plurality of grooves 74 in the form of a depression as shown in the perspective view of FIG. 10. Display panel 21 is inserted in groove 74 to be held at an end edge section 75 of groove 74.

As can be seen from FIG. 9B, cassette 22b or 24a is almost equal in the configuration to cassette 22a or 24b of FIG. 9A. However, cassette 22a or 24b of FIG. 9A is constructed such that holder plate 72 slides in a longitudinal direction of the cassette. Cassette 22b or 24a shown in FIG. 9B is configured such that holder plate 72 slides in a direction vertical to the longitudinal direction of the cassette.

In the embodiment of the display panel transporting apparatus, the positions of the loaded cassette supplying and discharging sections are not limited respectively to first station ST1 and 18th station ST18 shown in FIG. 4. The positions can be determined to efficiently transport cassettes according to, for example, layout of areas in the production line, which will be described later.

Subsequently, description will be given of operation of the embodiment of the display panel transporting apparatus in relation to a display panel production line.

The display panel transporting apparatus shown in FIG. 4 is installed as a transporting apparatus A and a transporting apparatus B in a transporting process area 84 allocated, as shown in FIG. 11A, in the proximity of a cutting process area 8a to cut a glass substrate according to size of liquid crystal panels, a filling process area 82 to fill liquid crystal panels with a liquid crystal, and a sealing process area 83 to seal a hole through which liquid crystal is fed in the panels.

Transporting apparatuses A and B respectively have a cassette supply hole 85 and a cassette discharge hole 86, which respectively correspond to first station ST1 and 18th station ST18 of the apparatus shown in FIG. 4. Apparatuses A and B also have a cassette supply hole 87 land a cassette discharge hole 88, which respectively correspond to tenth station ST10 and ninth station ST9 of the apparatus shown in FIG. 4.

Apparatus A removes liquid crystal panels from two cassettes containing, for example, 40 liquid crystal panels ejected from cutting process area 81 and loads 80 liquid crystal panels in an empty cassette to be delivered to filling process area 82. Apparatus B removes liquid crystal panels from a cassette which contains 80 liquid crystal panels and which is delivered from filling process area 82 and then loads 40 liquid crystal panels in two empty cassette to be delivered to sealing process area 83.

Through the operation above in transporting process area 84, the number of liquid crystal panels processed in the liquid crystal filling process can be efficiently increased without changing the number of liquid crystal panels processed in the cutting and sealing processes in the prior art. As a result, the liquid crystal panel manufacturing processes and the liquid crystal panel production line can be increased in efficiency without increasing the number of liquid crystal filling apparatuses; moreover, without influencing other existing processes and an existing production line, namely, by using the production line of the prior art.

In the relationship between the transporting apparatus and the production line, one unit of transporting apparatus C may be arranged in transporting process area 84 as shown in the block diagram of the production line shown in FIG. 11B. In this situation, transporting apparatus C achieves the operation to move liquid crystal panels from two cassettes each including 40 liquid crystal panels ejected from cutting process area 81 and loads 80 liquid crystal panels in an empty cassette to be fed to filling process area 82 and the operation to move liquid crystal panels from the cassette including 80 liquid crystal panels from filling process area 82 and loads 40 liquid crystal panels in each of two empty cassettes to be fed to sealing process area 88. The number and positions of the liquid crystal panel transporting apparatuses can be selectively determined in consideration of production efficiency in the liquid crystal panel production line.

Description will now be given of operation of display panel transporting apparatuses installed in the liquid crystal panel production line by referring to an example of the production line shown in FIG. 11A.

First, loaded cassette 22a ejected from area 81 is fed to apparatus A. Namely, loaded cassette 22a in which 40 display panels are housed in a longitudinal direction of apparatus A is placed on first station ST1 of supply mechanism 27. Cassette 22 on first station ST1 is transported by an intermittent transporting mechanism, not shown, to fifth station ST5. A stop position of cassette 22a in fifth station ST5 is corrected by positioning mechanism 39 of frame 33 and a cassette positioning mechanism, not shown, of horizontal feed mechanism 46.

Display panel vertical feed mechanism 45 below fifth station ST moves upward up to a lower end surface of display panels 21 of cassette 22a to support the lower end surface of 40 panels 21 as shown in FIG. 6. Plate 58 of supporting mechanism 47 moves downward to insert teeth of comb-shaped plate 58 in a gap between display panels in an upper end surface of display panels 21. Since transporting unit 26 is set to tilt about 1° toward a side of transporting unit 25, the teeth of plate 58 can be easily inserted in the gap. When plate 58b moves quite a small distance relative to plate 58a, the pitches of display panels 21 are equalized in its upper end surface and the upper end surface of display panels is thereby supported. Thanks to the equal pitch, when display panel 21 is removed from or is housed in the cassette, display panel 21 is not brought into contact with groove 74 of holder plate 72 shown in FIG. 10. Consequently, display panels 21 can be smoothly transported without any damages such as crack and break.

Thereafter, while supporting the lower and upper end surfaces of panels 21, vertical feed mechanism 45 and plate 58 of supporting mechanism 47 moves synchronously upward. Panel holding mechanism 48 then slides to support a lower end surface and a side end surface of panels 21 by rollers 62 and 63 as shown in FIG. 5. Correcting mechanism 49 also slides to insert teeth of comb-shaped plate 69 in a gap between panels 21 in the side end surface of panels 21. When plate 69b moves quite a small distance relative to plate 69a, the pitches of display panels 21 are equalized in the side end surface. Thanks to the equal pitch, when display panel 21 is removed from or is housed in the cassette, display panel 21 is not brought into contact with groove 74 of holder plate 72 shown in FIG. 10. Therefore, display panels 21 can be smoothly transported without any damages such as crack and break.

After the upper and lower end surfaces and both side surfaces of panels 21 are supported, vertical feed mechanism 45 moves downward to thereby complete the removal of display panels 21 from loaded cassette 22a. Empty cassette 24b from which panels 21 are removed is transported up to ninth station ST9 to be transported from the display panel transporting apparatus. Vertical feed mechanism 45 at the lower position moves along a groove of slide guide 54 disposed in frame 33 to a position below 14th station ST14.

While panels 21 are being kept supported as above, horizontal feed mechanism 46 slides up to a position above 14th station ST14. Empty cassette 24a on tenth station 10 is transported up to 14th station ST14. However, during the transportation, the direction of empty cassette 24a is changed 90° by rotating mechanism 30 in 12th station. A stop position of cassette 24a in 14th station ST14 is corrected, like in the case of loaded cassette 22a, by positioning mechanism 39 of frame 33 and a cassette positioning mechanism, not shown, of horizontal feed mechanism 46. When 40 panels 21 supported at a position over 14th station ST14 move downward, empty cassette 24a stops at a position at which 40 panels 21 are housed in a front half section of cassette 24a on a front side of the moving direction.

In the housing operation of panels 21 in cassette 24a, vertical feed mechanism at a position below 14th station ST14 first moves upward to support a lower end surface of panels 21. Panel supporting mechanism 48 and pitch correcting mechanism 49 slides outward and then vertical feed mechanism 45 and plate 58 of supporting mechanism 47 synchronously moves downward. The lock of plate 58 is released in supporting mechanism 47, plate 58 moves upward and mechanism 45 moves downward to thereby complete the housing operation of 40 panels Cassette in which 40 panels 21 are housed as above travels a half of the total cassette length in the moving direction. Thereafter, for 40 panels 21 housed in loaded cassette 22a transported up to fifth station ST5, transporting mechanism 34 conducts again the panel move operation above. As a result, 80 panels 21 are housed in cassette 24a, which therefore becomes loaded cassette 22b. The direction of cassette 22b is changed 90° in 16th station ST16 to be fed up to 18th station ST18. Cassette 22b is then removed to be supplied to filling process area 82.

Loaded cassette 22b in which 80 panels are housed as above is then filled with liquid crystal in filling process area 82. Cassette 22b is then delivered to transporting apparatus B. Although not shown, cassette 22b is mounted on first station ST1 of apparatus B. Transporting apparatuses A and B are substantially equal in constitution to each other.

In apparatus B, 80 panels 21 are removed from cassette 22b such that 40 panels 21 are housed in each of two empty cassettes. Since this operation is almost the same as that of transporting apparatus A and will not be described. However, since 40 panels 21 are housed in one cycle of transporting operation of panel transporting apparatus 34, there exists a slight difference in the movement of cassettes, for example, the cassette rotating operation of rotating mechanism 30 in association with the number of cassettes. In the filling process, liquid crystal fixes on the lower end surface of panels 21 to be transported by apparatus B. Consequently, liquid crystal which fixes on rollers 62 and 50 is to be appropriately wiped away by wiper mechanisms 43 and 44.

The loaded cassette in which 40 panels 21 are housed by the transporting operation of transporting apparatus B is fed to sealing process area 83 for a sealing process thereof As above, when display panel transporting apparatuses and display panel transporting units in accordance with the present invention are arranged in the neighborhood of a liquid crystal filling apparatus employed, for example, in a liquid crystal filling process of a liquid crystal panel production line, in an operation to transport a cassette loaded with liquid crystal panels from a cutting process to the filling process, the number liquid crystal panels of a cassette to be fed to the filling process can be automatically increased as compared with that of a cassette from the cutting process. In an operation to transport a cassette from the filling process to a sealing process, the number of liquid crystal panels of a cassette to be supplied to the sealing process can be automatically reduced as compared with that of a cassette ejected from the filling process. In addition, since the empty cassette from which the liquid crystal panels are removed can be automatically ejected and the empty cassette in which liquid crystal panels are to be housed can be automatically supplied, the liquid crystal panels can be efficiently transported.

Consequently, even when an existing production line of the prior art is used, the number of liquid crystal filling apparatuses need not be particularly increased. Moreover, efficiency of liquid crystal panel manufacturing processes and a liquid crystal panel production line can be increased without adversely influencing existing processes and an existing production line.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A display panel transporting apparatus, comprising:
    a loaded cassette supply mechanism for supplying a cassette in which display panels are housed in a longitudinal direction;
    an empty cassette discharge mechanism for discharging an empty cassette from which display panels are removed;
    an empty cassette supply mechanism for supplying an empty cassette to which display panels are to be housed;
    a loaded discharge supply mechanism for discharging a cassette in which display panels are housed; and
    a display panel transporting unit, including:
        a removal station disposed at a relay point between the loaded cassette supply mechanism and the empty cassette discharge mechanism for removing display panels; and
        a housing station disposed at the empty cassette supply mechanism and the real cassette discharge mechanism for housing display panels in an empty cassette.

2. A display panel transporting apparatus in accordance with claim 1, wherein
    the display panel transporting unit is placed substantially at a central position of the display panel transporting apparatus;
    the real cassette supply mechanism includes a cassette supply hole and the loaded cassette discharge mechanism includes a cassette discharge hole, the holes being arranged on a first side of the unit in the apparatus;
    the empty cassette discharge mechanism includes a cassette discharge hole and the empty cassette supply mechanism includes a cassette supply hole, the holes being arranged on a second side of the unit in the apparatus, the second side being opposite to the first side.

3. A display panel transporting apparatus in accordance with claim 1, wherein
each of the removal station and the housing station includes a cassette feed mechanism for changing a position to remove display panels from a cassette and a position to house display panels in a cassette.

4. A display panel transporting apparatus in accordance with claim 1, wherein
each of the cassette supply mechanism and the cassette discharge mechanism includes a cassette rotating mechanism for changing a direction of a cassette.

5. A display panel transporting apparatus in accordance with claim 1, wherein the cassettes are substantially equal in size to each other.

6. A display panel transporting apparatus in accordance with claim 5, wherein each of the cassettes includes:
a pair of outer frames;
a plurality of slide shafts; and
a pair of display panel holder plates,
at least one of the display panel holder plates being slidable on the slide shafts and being fixable at an arbitrary point on the slide shafts.

7. A display panel transporting apparatus in accordance with claim 1, wherein the display panel transporting unit includes:
a display panel vertical feed mechanism being movable between a position below the removal station and a position below the housing station, the feed mechanism removing display panels upward from a cassette and housing display panels downward in a cassette while supporting the display panels on a lower end surfaces thereof;
a display panel top support mechanism for supporting display panels on an upper end surface thereof and vertically moving in connection with the display panel vertical feed mechanism;
a display panel holder mechanism for holding a lower end surface and a side end surface of display panels removed from a cassette; and
a horizontal feed mechanism including the display panel top support mechanism and the display panel holder mechanism, the horizontal feed mechanism being movable from a point over the removal station to a point over the housing station.

8. A display panel transporting apparatus in accordance with claim 7, wherein the display panel vertical feed mechanism of the display panel transporting unit includes a display panel holding roller movable along a lower end surface of display panels.

9. A display panel transporting apparatus in accordance with claim 8, further including a wiper mechanism below the removal station and below the hosing station for removing dust and dirt fixed on the display panel holder roller of the display panel transporting unit.

10. A display panel transporting apparatus in accordance with claim 7, wherein the display panel top support mechanism of the display panel transporting unit includes a display panel upper surface pitch correcting mechanism,
the correcting mechanism including a comb-shaped plate including a first plate and a second plate,
the first plate sliding quite a small distance relative to the second plate.

11. A display panel transporting apparatus in accordance with claim 7, wherein the display panel holder mechanism of the display panel transporting unit includes:
a lower surface receiving roller for supporting a lower end surface of display panels; and
a side surface receiving roller for supporting a side surface of display panels.

12. A display panel transporting apparatus in accordance with claim 11, further including a wiper mechanism on each of both end sections of a track of a vertical feed stroke of a horizontal feed mechanism for removing dirt and dust fixed on the lower surface receiving roller of the display panel transporting unit.

13. A display panel transporting apparatus in accordance with claim 7, wherein the display panel transporting unit includes a display panel side surface pitch correcting mechanism,
the display panel side surface pitch correcting mechanism including a comb-shaped plate including a first plate and a second plate,
the first plate sliding quite a small distance relative to the second plate.

14. A display panel transporting apparatus in accordance with claim 1, wherein the display panel transporting unit is tilted quite a small angle in a pitch direction of display panels.

15. A display panel transporting apparatus in accordance with claim 1, further including a cassette positioning mechanism for correcting a stop position of a cassette to stop at the removal station and at the housing station.

16. A display panel transporting unit, comprising:
a display panel vertical feed mechanism being movable between a position below a removal station at which a cassette loaded with display panels in a longitudinal direction is placed to remove display panels therefrom and a position below a housing station at which a cassette is placed to house therein the removed display panels, the feed mechanism removing display panels upward from a cassette and housing display panels downward in a cassette while supporting the display panels on a lower end surfaces thereof;
a display panel top support mechanism for supporting display panels on an upper end surface thereof and vertically moving in connection with the display panel vertical feed mechanism;
a display panel holder mechanism for holding a lower end surface and a side end surface of display panels removed from a cassette; and
a horizontal feed mechanism including the display panel top support mechanism and the display panel holder mechanism, the horizontal feed mechanism being movable from a point over the removal station to a point over the housing station.

17. A display panel transporting unit in accordance with claim 16, wherein the display panel vertical feed mechanism of the display panel transporting unit includes a display panel holding roller movable along a lower end surface of display panels.

18. A display panel transporting unit in accordance with claim 17, further including a wiper mechanism below the removal station and below the hosing station for removing dust and dirt fixed on the display panel holder roller of the display panel transporting unit.

19. A display panel transporting unit in accordance with claim 16, wherein the display panel top support mechanism of the display panel transporting unit includes a display panel upper surface pitch correcting mechanism,
the correcting mechanism including a comb-shaped plate including a first plate and a second plate, the first plate sliding quite a small distance relative to the second plate.

20. A display panel transporting unit in accordance with claim 16, wherein the display panel holder mechanism of the display panel transporting unit includes:
   a lower surface receiving roller for supporting a lower end surface of display panels; and
   a side surface receiving roller for supporting a side surface of display panels.

21. A display panel transporting unit in accordance with claim 20, further including a wiper mechanism on each of both end sections of a track of a vertical feed stroke of a horizontal feed mechanism for removing dirt and dust fixed on the lower surface receiving roller of the display panel transporting unit.

22. A display panel transporting unit in accordance with claim 16, wherein the display panel transporting unit includes a display panel side surface pitch correcting mechanism,
   the display panel side surface pitch correcting mechanism including a comb-shaped plate including a first plate and a second plate,
   the first plate sliding quite a small distance relative to the second plate.

23. A display panel transporting unit in accordance with claim 16, wherein the display panel transporting unit tilts quite a small angle in a pitch direction of display panels.

24. A display panel transporting unit in accordance with claim 16, further including a cassette positioning mechanism for correcting a stop positioning of a cassette to stop at the removal station and at the housing station.

25. A display panel transporting apparatus, comprising:
   a loaded cassette supply mechanism for supplying a cassette in which display panels are housed;
   an empty cassette discharge mechanism for discharging an empty cassette from which display panels are removed;
   an empty cassette supply mechanism for supplying an empty cassette to which display panels are to he housed; and
   a loaded discharge supply mechanism for discharging a cassette in which display panels are housed; and
   a display panel transporting unit, said unit comprising a removal station disposed at a relay point between the loaded cassette supply mechanism and the empty cassette discharge mechanism for removing display panels.

26. The display panel transporting apparatus, as claimed in claim 25, further comprising:
   a housing station disposed at a relay point between the empty cassette supply mechanism and the loaded cassette discharge mechanism for housing display panels in an empty cassette.

27. A display panel transporting unit, comprising:
   a display panel feed mechanism for moving display panels;
   a removal station at which a cassette loaded with display panels is placed in a position adjacent said display panel feed mechanism for removal of said display panels from said cassette; and
   a housing station in which a cassette is placed in a position adjacent said display panel feed mechanism to house therein the removed display panels.

28. The display panel transporting unit, as claimed in claim 27, wherein said feed mechanism removes display panels from a cassette and housing display panels in a cassette while supporting the display panels on a lower end surfaces thereof.

29. The display panel transporting unit, as claimed in claim 27, wherein said display panel feed mechanism comprises a display panel vertical feed mechanism movable between a position below said removal station and a position below said housing station.

30. The display panel transporting unit as claimed in claim 27, further comprising:
   a display panel top support mechanism or supporting display panels on an upper end surface thereof and vertically moving in connection with the display panel feed mechanism; and
   a display panel holder mechanism for holding a lower end surface and a side end surface of display panels removed from a cassette.

31. The display panel transporting unit, as claimed in claim 30, further comprising:
   a horizontal feed mechanism including said display panel top support mechanism and said display panel holder mechanism, said horizontal feed mechanism being movable from a point over the removal station to a point over the housing station.

* * * * *